US012635104B2

(12) United States Patent
Majd et al.

(10) Patent No.: US 12,635,104 B2
(45) Date of Patent: May 19, 2026

(54) DISTRIBUTED POWER UNITS FOR DATACENTERS

(71) Applicant: Microsoft Technology Licensing, LLC, Redmond, WA (US)

(72) Inventors: Afshin Majd, Seattle, WA (US); Ryan Douglas Carver, Seattle, WA (US); Ehsan Nasr Azadani, Sammamish, WA (US); Lalu Vannankandy Kunnath, Snoqualmie, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 418 days.

(21) Appl. No.: 18/196,925

(22) Filed: May 12, 2023

(65) Prior Publication Data

US 2024/0268056 A1 Aug. 8, 2024

Related U.S. Application Data

(60) Provisional application No. 63/444,141, filed on Feb. 8, 2023.

(51) Int. Cl.
*H05K 7/14* (2006.01)
*G05B 19/042* (2006.01)
(52) U.S. Cl.
CPC ......... *H05K 7/1492* (2013.01); *G05B 19/042* (2013.01); *G05B 2219/2639* (2013.01)
(58) Field of Classification Search
CPC ................ H05K 7/1492; G05B 19/042; G05B 2219/2639
See application file for complete search history.

(56) References Cited

U.S. PATENT DOCUMENTS

| | | | |
|---|---|---|---|
| 9,075,592 B2 | 7/2015 | Yoshida | |
| 2004/0023085 A1* | 2/2004 | Lightner | H01M 8/0612 48/197 R |
| 2011/0304211 A1 | 12/2011 | Peterson et al. | |
| 2017/0047772 A1 | 2/2017 | Wang et al. | |
| 2017/0063093 A1 | 3/2017 | Wang | |

(Continued)

FOREIGN PATENT DOCUMENTS

EP 4106143 A1 12/2022

OTHER PUBLICATIONS

U.S. Appl. No. 63/444,141, filed Feb. 8, 2023.

(Continued)

*Primary Examiner* — Michael W Choi
(74) *Attorney, Agent, or Firm* — Workman Nydegger

(57) ABSTRACT

Techniques for providing auxiliary power to a datacenter, which is normally serviced by a power utility, are disclosed. The system includes a controller, a first stamp, and a second stamp. A common DC bus couples the first stamp to the second stamp on a DC side. A common AC bus couples the first stamp to the second stamp on an AC side (e.g., the output of the stamps). An AC breaker is disposed on the AC bus between the first stamp and the second stamp. The controller controls whether the AC breaker is open or closed. A default state of the AC breaker is an open state. The control of the breakers can occur for various reasons, including whether the utility is available or whether the utility is not available. The utility might not be available due to a utility failure or due to other reasons.

20 Claims, 8 Drawing Sheets

(56) References Cited

U.S. PATENT DOCUMENTS

| | | | |
|---|---|---|---|
| 2017/0294782 A1 | 10/2017 | Navarro | |
| 2020/0044266 A1* | 2/2020 | Wang ............... | H01M 8/04917 |
| 2021/0135486 A1 | 5/2021 | Liu | |
| 2024/0170969 A1* | 5/2024 | Majd ................ | H01M 8/04656 |

OTHER PUBLICATIONS

International Search Report and Written Opinion received for PCT Application No. PCT/US2024/013635, Jun. 14, 2024, 18 pages.
International Preliminary Report on Patentability (Chapter 1) received for PCT Application No. PCT/US2024/013635, mailed on Aug. 21, 2025, 12 Pages.

* cited by examiner

Utility
100

Architecture
600

Resource(s)
620

Controller
605

Stamp
Controller
615

Stamp
Controller
610

*Figure 6*

Process Flow
700

DISTRIBUTED POWER UNITS FOR DATACENTERS

CROSS-REFERENCE TO RELATED APPLICATIONS

This application claims the benefit of and priority to United States Provisional patent application Ser. No. 63/444, 141 filed on Feb. 8, 2023 and entitled "Distributed Power Units for Datacenters," and which application is expressly incorporated herein by reference in its entirety.

BACKGROUND

A "datacenter" is a facility that includes various different computing systems and architectures. The datacenter is generally designed to store and share data, applications, or even to provide infrastructure to clients. Examples of the different systems that are included in a datacenter include servers, switches, routers, security systems, and so on.

Maintaining and operating a datacenter can be a huge task. For instance, it is typically the case that customers expect their data to be available on demand at any time of day. What this means, then, is that the datacenter has to be designed so as to be operational at all times. As a result, the tasks involved with providing power to a datacenter are often considered to be of high priority.

Most datacenters are powered via a local region's electrical power grid as the primary or main source of power. This electrical grid provides a continuous stream of energy to the datacenter in a reliable manner. Often, it is the case that the datacenter includes various different transformers and other power components to convert the incoming power to a power signal that is usable by the computing elements in the datacenter.

In addition to the electrical power grid, it is often the case that a datacenter is equipped with a backup source of power, such as a generator, an uninterrupted power supply (UPS), battery system, or a capacitor system for each line-up of the datacenter, where a "line-up" refers to a set of computing systems that can optionally be directly powered by a backup power system. This secondary power system is designed to provide power to the datacenter in the event that the power grid fails.

Solid oxide fuel cell (SOFC) technology is an excellent resource for baseload power, and it can operate independently or in parallel with the utility (i.e. the power grid). Various different fuel cell inverters can operate at a fixed power setpoint and can be used to generate a fixed amount of power (grid following mode). In grid following mode, the utility can optionally pick up any difference, delta, or deficit that may exist between the fuel cell generation and load demand. In conventional SOFC grid forming application (e.g., stand-alone) mode, the fuel cell step load capability depends on the pre-packaged ultra-capacitors for the loads, where the behavior for those loads is predictable or is designed to allow a certain load shedding scheme in micro-grid (MG) operation. Notably, however, the load behavior in a datacenter is often un-predictable. If SOFC technology is to be used in a datacenter, what is needed, therefore, is an improved technique for managing how SOFCs can be used to provide power to a datacenter.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments disclosed herein relate to systems, devices, and methods for providing auxiliary power to a datacenter that is normally serviced by a power utility.

Some embodiments include a controller, a first stamp, and a second stamp. Of course, any number of stamps may be used, where each stamp is made of a number of fuel cell-inverter pairs connected to one step-up transformer. The embodiments further include a common direct current (DC) bus that couples the first stamp to the second stamp and a common alternating current (AC) bus that couples the first stamp to second stamp. An AC breaker is placed on the AC bus between the first stamp and the second stamp. The controller controls whether the AC breaker is open or closed. A default state of the AC breaker is an open state.

Some embodiments cause a set of stamps to operate in a grid following mode, where the stamps are coupled together using a common AC bus. For instance, some embodiments determine that a power providing utility for a datacenter is currently available to provide power to the datacenter. The embodiments cause a set of breakers that are located on a common AC line to remain open. The set of breakers couple, on the AC line, multiple stamps that are able to provide supplemental power to the datacenter. The embodiments cause the stamps to operate in a grid following mode while the utility is providing the power to the datacenter.

Some embodiments cause a set of stamps to provide power to a datacenter, where the stamps are coupled together using a common AC bus. For instance, some embodiments determine that a power providing utility for a datacenter is currently not available to provide power to the datacenter. The embodiments determine that the utility is not currently available due to a utility failure. The embodiments cause a set of breakers that are located on a common AC line to remain open. The set of breakers couple, on the AC line, multiple stamps that are able to provide supplemental power to the datacenter. The embodiments activate a set of inverters that are associated with the stamp. The stamps provide the power to the datacenter.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 6 illustrates an architecture designed to facilitate the control of certain stamps.

DETAILED DESCRIPTION

Figure 1:
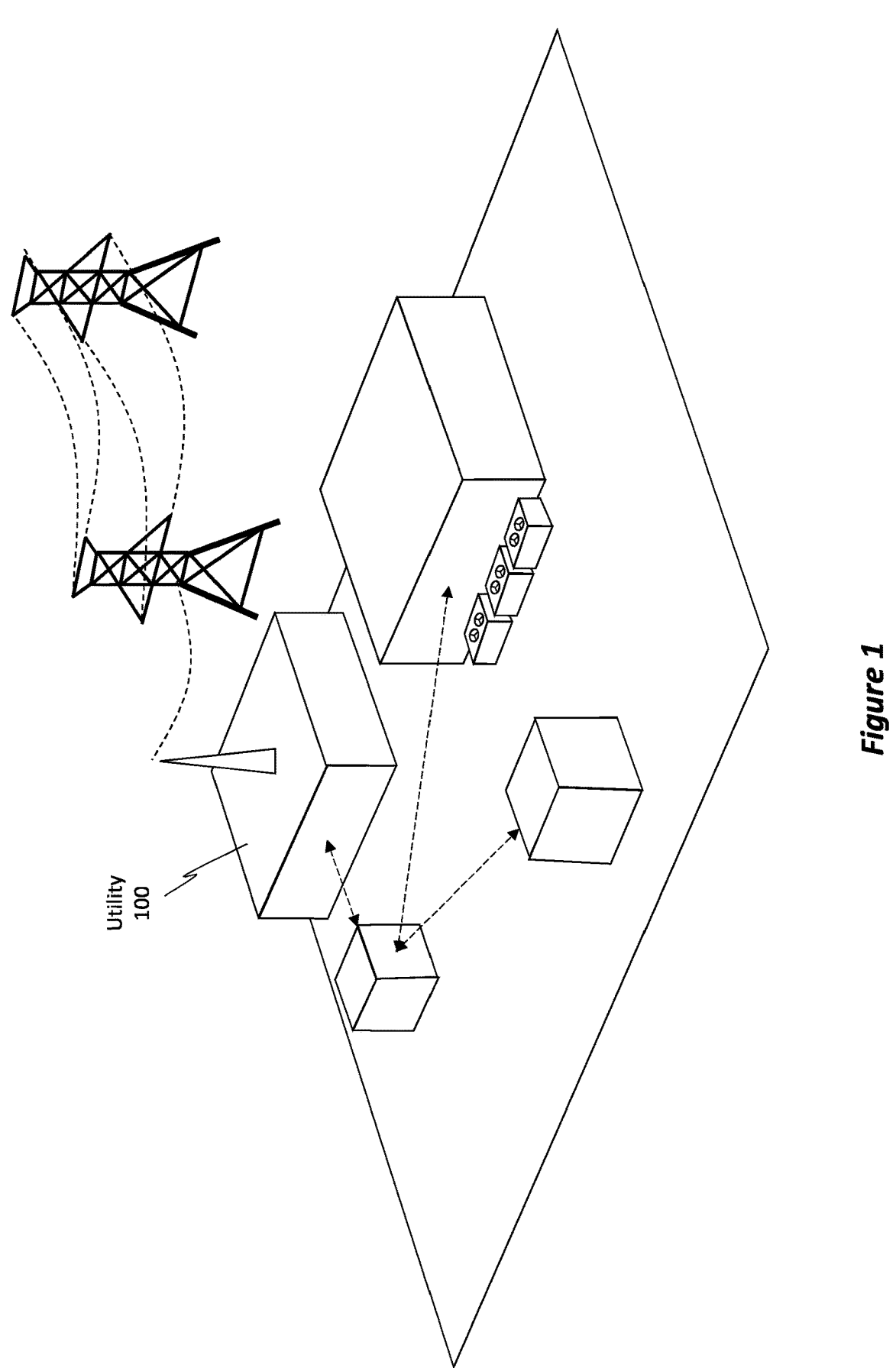
FIG. 1 illustrates an example of a power providing utility.

The disclosed embodiments generally relate to a system that provides auxiliary power to a datacenter that is normally serviced by a power utility. The embodiments also relate to the control of that system.

Some embodiments include a controller, a first stamp, and a second stamp. A common DC bus couples the first stamp to the second stamp and a common AC bus couples the first stamp to the second stamp. An AC breaker is disposed on the AC bus between the first stamp and the second stamp. The controller controls whether the AC breaker is open or closed. The default state of the AC breaker is open.

Some embodiments cause a set of stamps to operate in a grid following mode, where the stamps are coupled together using a common AC bus. A power providing utility for a datacenter is currently available to provide power to the datacenter. A set of breakers, which are located on a common AC line, are open. The set of breakers couple, on the AC line, multiple stamps that are able to provide supplemental power to the datacenter. The embodiments cause the stamps to operate in a grid following mode while the utility is providing the power to the datacenter.

Some embodiments cause a set of stamps to provide power to a datacenter, where the stamps are coupled together using a common AC bus. A power providing utility for a datacenter is currently not available to provide power to the datacenter due to a utility failure. The embodiments cause a set of breakers that are located on a common AC line to remain open. The set of breakers couple, on the AC line, multiple stamps that are able to provide supplemental power to the datacenter. The embodiments activate a set of inverters that are associated with the stamp. The stamps provide the power to the datacenter.

Examples of Technical Benefits, Improvements, and Practical Applications

The following section outlines some example improvements and practical applications provided by the disclosed embodiments. It will be appreciated, however, that these are just examples only and that the embodiments are not limited to only these improvements.

The disclosed embodiments bring about numerous benefits, advantages, and practical applications to the technical field of power system management, particularly for a datacenter. In particular, the disclosed embodiments advantageously provide for a modular, flexible datacenter power control application. The embodiments also provide for the integration of a power source (e.g., an SOFC or any other comparable technology) into the line-ups of the datacenter, where (as mentioned previously) a "line-up" refers to a set of computing systems that can optionally be directly powered by the SOFC system.

The embodiments also advantageously provide a full DC bus connection among all stamps, where a "stamp" refers to a combination of a set of one or more energy sources (e.g., SOFCs) and one or more ultra-capacitors connected to one step-up transformer. The embodiments also allow a new connection to be made through normally open circuit breakers that exist on the AC side of the stamps. Yet another benefit relates to the control processes used to manage these various different constructs.

By practicing the disclosed principles, the embodiments allow for an unlimited expansion of the power system plan, such as by a phase-by-phase process or by the inclusion of a few modules (aka power units) at a time and adding more as the line-ups or demand increase. Also, the disclosed embodiments can be deployed fully in a short period of time (e.g., a single day or less).

Unlike traditional SOFC configurations that work with central units installed to feed a fixed load, the disclosed new design allows flexibility and a customized, expandable solution at the line-up level. This includes flexibility in the sizing of each energy server ("ES") (i.e. a collection of specific energy sources, such as SOFCs) as well as the stamps (i.e. several energy servers connected to one step-up transformer) in which those ES operate. Optionally, the embodiments allow for the stamps to be of equal size or to be unequal in size (e.g., given a datacenter's design, they may be sized equally, but they do not have to be).

The demand for datacenters is likely to grow significantly over the next few years. It is often desirable to be able to disconnect the datacenter from the conventional grid and to have control over a datacenter "microgrid" (i.e. a localized power generation system that provides the baseload power coverage to the datacenter). The baseload power for that microgrid comes from local energy resources that can be renewable and/or green.

There are a few available options when it comes to the baseload coverage, and it has been found that SOFCs are able to outperform other existing technologies (e.g., natural gas (NG) or H2 conversion to electricity) by a large margin in terms of efficiency and emissions. The disclosed embodiments are able to build SOFC-based microgrids that provide reliable and scalable on-demand power.

As indicated above, the datacenter industry is going through an exponentially growing demand and needs to meet this demand with building datacenters in local regions. Sometimes, however, the regional utility/power grid cannot provide the capacity or the consistency needed to power these datacenters. Datacenter builders are thus having to create their own microgrids, which include distributed energy resources. It is often desirable that these distributed energy resources be (i) designed to reduce emissions, (ii) reliable, (iii) redundant, and (iv) scalable. The disclosed solutions can scale up or down to fit any design constraint.

Advantageously, the disclosed embodiments also provide an upper 50% to lower 60% efficiency for the natural gas to electricity conversion, which can be increased by 20-30% when combined with some heat recovery technology. It should be noted how SOFCs can also work with hydrogen instead of natural gas as the fuel if that infrastructure becomes available. Utilizing H2 can also make the entire electricity production a zero-emission process (assuming green hydrogen as fuel). Accordingly, the above benefits, as well as many others, will now be described in more detail in the remaining sections of this disclosure.

Utility And Datacenters

Attention will now be directed to FIG. 1, which illustrates an example utility 100 that is capable of providing power to a grid. Utility 100 can be any type of power generating utility, without limit. Examples of utility can include any type of fossil fuel utility, hydroelectric utility, solar utility, wind utility, and so on. The utility 100 provides power to remotely located components via any number of transmission lines, as shown in FIG. 1.

Figure 2:
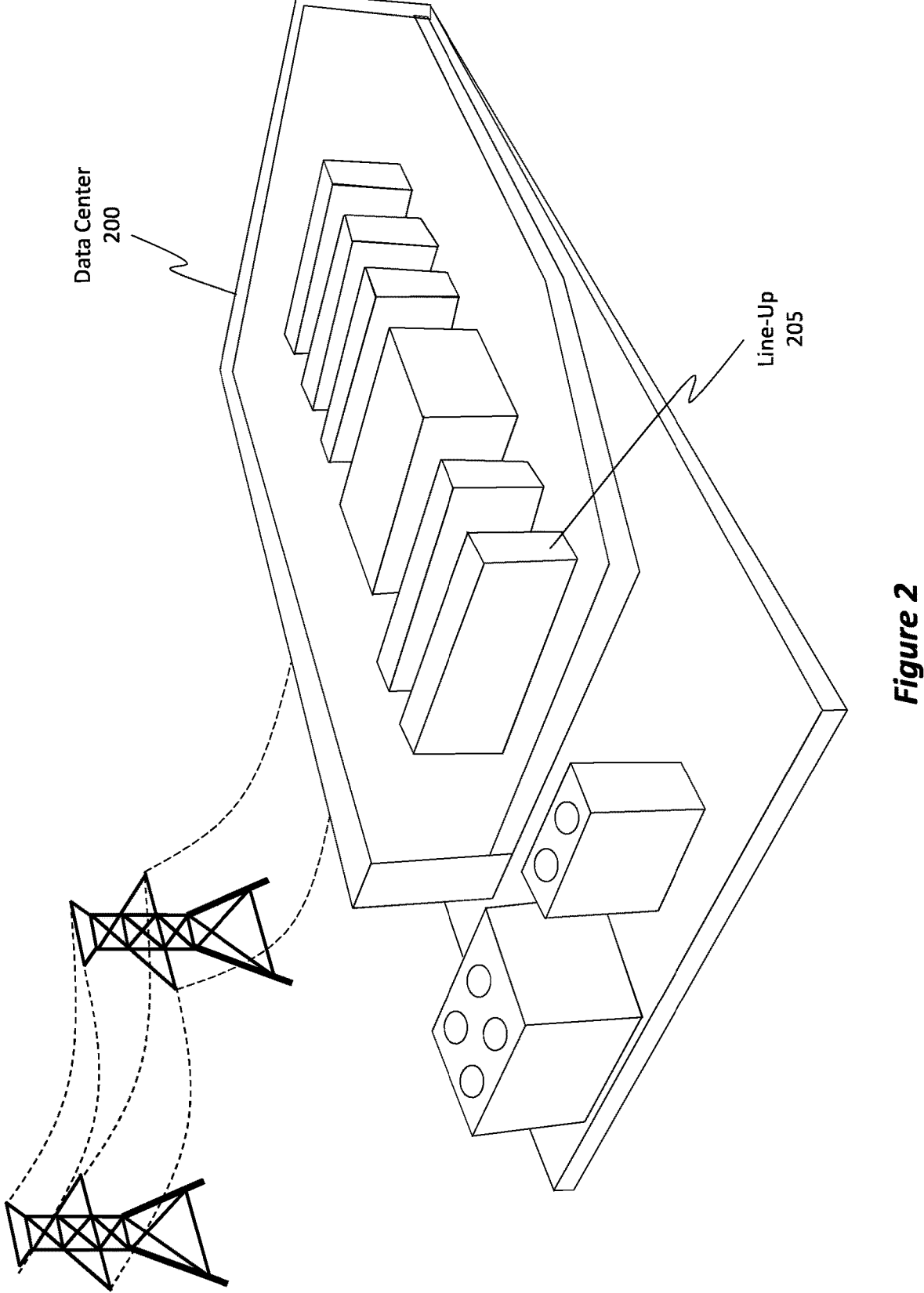
FIG. 2 illustrates an example of a datacenter.

FIG. 2 shows the transmission lines that provide power from the utility 100 of FIG. 1. These transmission lines are connected, in this example scenario, to a datacenter 200. Datacenter 200 includes any number of line-ups, such as line-up 205. As mentioned, a line-up refers to a set of computing elements that can be powered, as a collection, via the utility as well as via a secondary source, such as the SOFCs mentioned earlier. Line-ups can include any number of servers, routers, switches, and so forth. Optionally, power isolation can exist between different line-ups.

The datacenter 200 also includes, though they are not labeled, any number of cooling or climate control systems, ventilation systems, computing elements, and so on, without limit. It is highly desirable to provide a consistent, reliable power signal to the datacenter 200. Typically, that power signal is provided by the utility. Sometimes, however, the utility may go offline or there may be a brown or black out. To account for such potential scenarios, the datacenter typically includes or has access to a second power source, such as a battery bank, capacitor bank, SOFCs, or any other power generating element. These elements can operate in parallel with the utility. In the event the utility goes offline, then those other power generating elements can be used to provide power to the power grid for at least a period of time. The disclosed embodiments are directed to an improved configuration and usage of that secondary or supplemental power system.

Supplemental Power Design System

The disclosed embodiments provide a distributed energy solution to cover a datacenter's load demands using an energy resource or power unit (e.g., an SOFC). The power unit provides power to the datacenter either in parallel with a utility (e.g., a so-called "grid following" mode) or as an independent voltage source (e.g., a so-called "grid forming" mode). The power unit works as a current source when in parallel with the utility and as a voltage source when working in a microgrid or so-called "islanded" mode.

With the "grid following" mode, the system is provided a set point. The system then relies on the voltage and frequency to generate a desired level of power (i.e. the set point).

As an example, suppose the system is instructed to operate at 1 MW. The system will then operate to provide 1 MW of power.

When the system is in "grid forming" mode, the system follows the load as the load goes up or down. When the utility is available, whatever deficit exists between the power generated by the system and the load demand is picked up by the utility. That is, in grid forming mode, the system scales with the load. A seamless transition can occur between the grid forming mode and the grid following mode in the case of failure of the utility. Optionally, the combination of a battery, an ultra-capacitor, and a solid-state fuel cell can cover the load for a prolonged period of time.

The voltage source operation of the power unit with the droop functionality allows for the scalable addition of other distributed energy resources to the same microgrid system, where the second or subsequent distributed energy resources can work in grid forming or grid following mode. The proposed distributed energy resource configuration provides a reliable, scalable, redundant, and 24/7 power source to the datacenter.

The disclosed solutions and architectures are composed of a number of stamps, each capable of operating at different voltage levels depending on the DC load block. The stamp power rating can be scaled up or down depending on the demand load and the design. Each stamp is made up of one or more energy servers. Both the size of the power units/modules in an energy server and the number energy servers in a stamp can change, so there is 100% flexibility in the disclosed modular solution.

The system can black start (i.e. the process of starting the system for the very first time, such as perhaps after a blackout event) for the first time with or without the utility (i.e. the power grid). After the black start, the modules in the stamps are monitored continuously and are concurrently maintainable. The design comes with a customizable number of ultra-capacitors, which can provide instantaneous power for fast load changes. The solution can also optionally utilize natural gas infrastructure or biogas. The fuel cell system does not necessarily rely on a battery as an internal resource, though a battery can be used. It should be noted how natural gas infrastructure is much more reliable than electrical infrastructure, which significantly improves the availability of this scheme versus that of the utility.

Example Architecture

Figure 3:
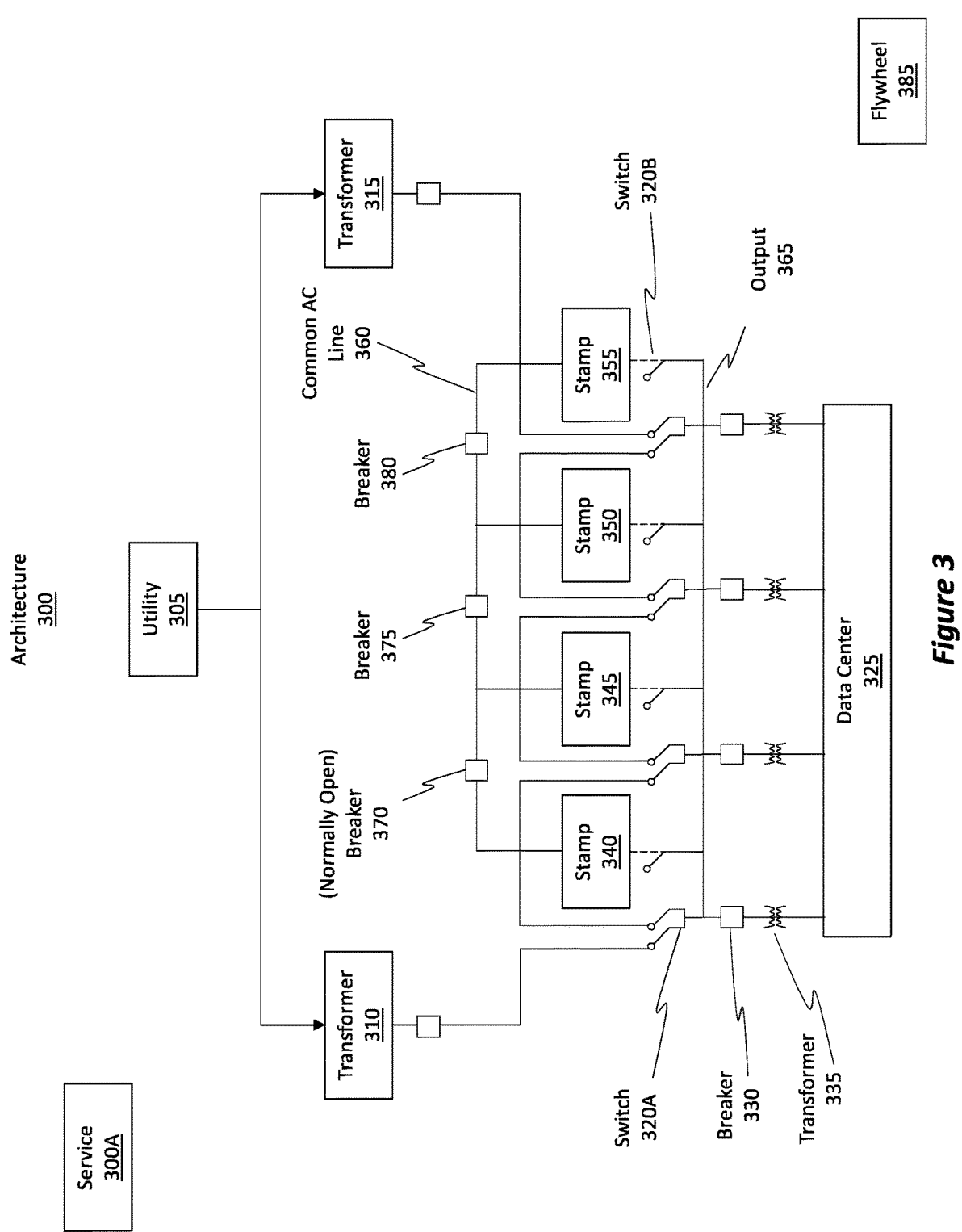
FIG. 3 illustrates an improved architecture capable of providing auxiliary or supplemental power to a datacenter.

Attention will now be directed to FIG. 3, which illustrates an example architecture 300 that can be used to provide the disclosed benefits and advantages. Architecture 300 is shown as including or as being connected to a utility 305, which is representative of the utility 100 from FIG. 1. Utility 305 can be connected to the system in multiple different pathways. For instance, FIG. 3 shows a left pathway in which the utility 305 is connected to a first transformer 310 and a corresponding breaker (not labeled, but it is shown as the square underneath the transformer 310). Additionally, FIG. 3 shows a right pathway in which the utility 305 is connected to a second transformer 315 and a corresponding breaker (not labeled, but it is shown as the square underneath the transformer 315).

Architecture 300 includes a service 300A. As used herein, the term "service" refers to an automated program that is tasked with performing different actions based on input. In some cases, service 300A can be a deterministic service that operates fully given a set of inputs and without a randomization factor. In other cases, service 300A can be or can include a machine learning (ML) or artificial intelligence engine.

As used herein, reference to any type of machine learning or artificial intelligence may include any type of machine learning algorithm or device, convolutional neural network(s), multilayer neural network(s), recursive neural network(s), deep neural network(s), decision tree model(s) (e.g., decision trees, random forests, and gradient boosted trees) linear regression model(s), logistic regression model(s), support vector machine(s) ("SVM"), artificial intelligence device(s), or any other type of intelligent computing system. Any amount of training data may be used (and perhaps later refined) to train the machine learning algorithm to dynamically perform the disclosed operations.

In some implementations, service 300A is a cloud service operating in a cloud environment. In some implementations, service 300A is a local service operating on a local device, such as one in the datacenter. In some implementations, service 300A is a hybrid service that includes a cloud component that communicates with a local component. The machine learning engine can optionally be used to tune the threshold values, the probability values, the increment values, and the accuracy values.

Service 300A can be used to dynamically control the various stamps, switches, breakers, transformers, and other components illustrated in FIG. 3. Service 300A can cause the architecture 300 to operate in the grid following mode or the grid forming mode.

Transformers 310 and 315 are step down voltage transformers that step the high voltage coming from the utility 305 to a medium voltage (e.g., a voltage that is at or higher than about 1000 V and that is at or below about 69 KV). The transformers 310 and 315 can be considered as being parts of respective medium voltage distribution systems. Another set of transformers will be described later, and those transformers step the medium voltage down to a low voltage that is usable by the datacenter.

The left and right pathways are also connected to a series of switches, one of which is labeled as switch 320A. The switches are usable by the embodiments to determine which pathway will be used to feed power to the datacenter 325, which is representative of the datacenter 200 of FIG. 2. If the left pathway is providing power to the datacenter, then the left portion of each switch is closed and the right portion of each switch is open. If the right pathway is providing power to the datacenter, then the right portion of each switch is closed, and the left portion of each switch is open.

The architecture 300 also shows a number of breakers (e.g., the empty rectangular boxes), one of which is labeled as breaker 330. These breakers can be used as a shut off switch for disconnecting power to the datacenter 325.

Additionally, any number of other transformers (e.g., transformer 335) can also be provided to further modify the voltage levels of the power signal being sent to the datacenter 325. For instance, transformer 335 converts medium voltage to a low voltage that is fed to the datacenter 325.

In accordance with the disclosed principles, the architecture 300 is further structured to include any number of so-called "stamps," such as stamp 340, stamp 345, stamp 350, and stamp 355. The stamps can be associated with switches as well, as shown by switch 320B. These stamps include the scalable modules (aka power units) that were mentioned previously. The architecture 300 is designed to enable any number of stamps to be easily incorporated into the architecture 300 so as to provide secondary or supplemental power to the datacenter 325. In this example scenario, there are four stamps, but one will appreciate how the number of stamps can vary based on the design needs of the datacenter 325. Furthermore, as additional computing elements are added to the datacenter 325 or as load on the existing datacenter 325 increases, additional stamps can also be added to the architecture 300.

The scheme shown in FIG. 3 is built of distributed scalable stamps connected to the medium voltage side of the step-down transformers (e.g., transformers 310 and 315), which is a unique configuration relative to traditional power systems. That is, this particular configuration (i.e. one where the stamps are sized to the line-up demand with the adjustable built-in redundancy and one where the stamps are connected at the medium voltage level) is a new configuration.

Another unique aspect of the disclosed embodiments is that the DC connections of the stamps can also be connected internally as well as across stamps, such that the DC connections from one stamp are coupled to the DC connections of a different stamp. In doing so, the connected DC sides form a large pool of DC energy, which grows as more modules (i.e. power units) are added.

Yet another unique aspect of the disclosed embodiments is that the AC connections of the stamps can also be connected across stamps. The AC sides are connected through various circuit breakers that are normally open (e.g., breaker 370, 375, 380). As will be discussed in more detail later, the breakers (e.g., breakers 370, 375, and 380) close during power startup when the utility is not available (e.g., so-called "islanded" operation) and open upon completion of a black start process to limit the fault current on AC side. Doing so allows each fuel cell module (i.e. power unit) to feed its own load (i.e. a line-up), while those stamps can all use a common pool of DC energy.

The AC side normally open circuit breakers (e.g., breakers 370, 375, and 380) remove the need for the synchronization among all the AC power units, even when the size increases, such as by adding new stamps. This design provides flexibility to customize each module/power unit and to add them together to match the datacenter size. This idea offers a unique and novel supplemental power scheme to allow phase-by-phase construction or a full-size one-time deployment.

As stated above, each respective stamp may be tasked with servicing a particular line-up in the datacenter 325. For instance, stamp 340 may service a first line-up in the datacenter 325; stamp 345 may service a second line-up in the datacenter 325; stamp 350 may service a third line-up in the datacenter 325; and stamp 355 may service a fourth line-up in the datacenter 325.

In accordance with the disclosed principles, the architecture 300 can be designed so that the stamps have a common direct current (DC) bus, as will be shown later. Furthermore, the architecture 300 can also be designed so that the stamps have a common alternating current (AC) bus, as shown by common AC line 360. Notice, the common AC line 360 can include logical breaks in the form of breakers that are normally open, as shown by breakers 370, 375, and 380. FIG. 3 also shows the output 365 of the stamps and how that output 365 is connected to the utility line, which feeds power to the datacenter 325.

Stated differently, the architecture 300 is structured to provide for various different breakers between the different stamps. For instance, breaker 370 is an AC breaker on the common AC line 360, and breaker 370 is logically disposed between stamp 340 and the other stamps. Breakers 375 and 380 are also AC breakers, and they provide further breaks between the different stamps. These breakers can be controlled during a black start and during a ramp up process, as will be discussed in more detail later. In some cases, breakers 370, 375, and 380 are "normally open" breakers, and the opening and closing of those breakers can be used to control in-rush current, which may occur during a black start. When operating in the grid forming mode, the demand on the fuel cells/power units is harder. Connecting the fuel cells on the AC side, however, helps to alleviate the burden on the fuel cells, particularly for startup so as to adjust for the in-rush current.

In some cases, the architecture 300 can include a flywheel 385 to provide power to the datacenter 325. Further details on this aspect will be provided later. Generally, the flywheel 385 can act as an alternative to an ultra-capacitor.

Figure 4:
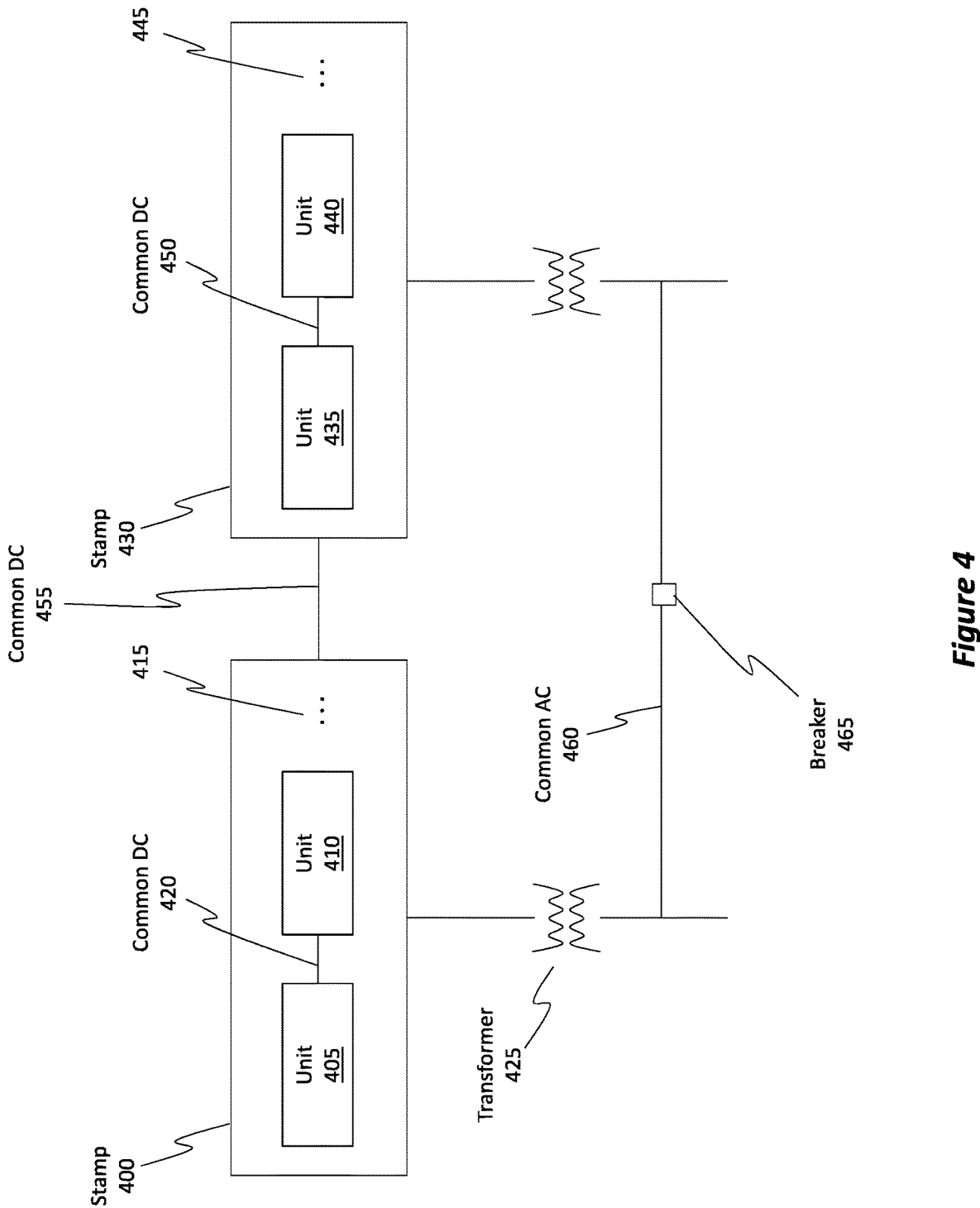
FIG. 4 illustrates various examples of stamps.

FIG. 4 shows an example of a stamp 400, which is representative of any of the stamps shown in FIG. 3. Stamp 400 is shown as including a first power unit 405 and a second power unit 410. The ellipsis 415 demonstrates how any number of power units can be included in a single stamp. The power units are connected to one another in that they share a common DC bus, as shown by common DC 420. The stamp 400 is connected to or optionally includes a transformer 425, which is distinct from the transformer 335 from FIG. 3.

FIG. 4 shows a second stamp 430. Stamp 430 includes a first power unit 435 and a second power unit 440. The ellipsis 445 demonstrates how this stamp can also include any number of power units. Optionally, the number of power units in stamp 400 may be different than the number of power units in stamp 430. The power units in stamp 430 also share a common DC bus, as shown by common DC 450. Additionally, the stamp 400 can be connected to the stamp 430 via a common DC bus, as shown by common DC 455. Thus, the power units in a single stamp have a common DC bus. Furthermore, the power units in a first stamp can be connected to the power units of a second stamp using a common DC bus.

FIG. 4 also shows how the stamps 400 and 430 can share a common AC bus, as shown by common AC 460. The common AC 460 is representative of the common AC line 360 from FIG. 3. A breaker 465 is also shown. Breaker 465 is representative of any of the breakers 370, 375, or 380 from FIG. 3. Breaker 465 can be viewed as being a breaker that is "normally open." When the breaker 465 (or the breakers 370, 375, or 380) are open, then each stamp is servicing only its own respective line-up and no synchronization is performed or needed between the different stamps. When the breakers are open, each stamp is operating independently and is feeding its own load on the AC side. One primary benefit of the breakers 465, 370, 375, and 380 occurs when black start is needed and when the utility is not available.

Figure 5:
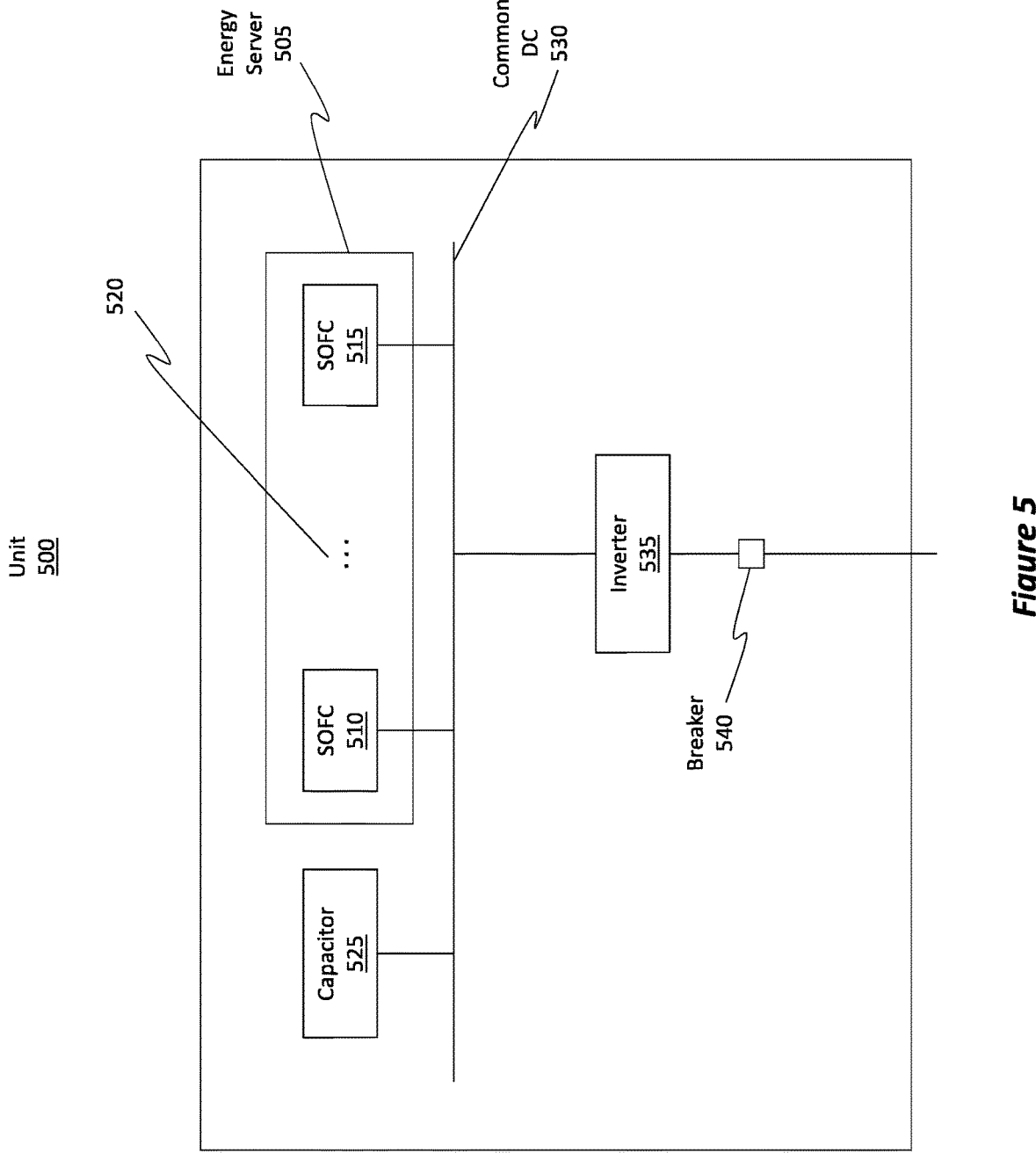
FIG. 5 illustrates an example of a power unit.

FIG. 5 provides further details regarding the power units 405, 410, 435, and 440 of FIG. 4. In particular, FIG. 5 shows a unit 500, which is representative of any of the power units just mentioned.

Unit 500 is shown as including an energy server 505, which includes a first SOFC 510 and a second SOFC 515. The ellipsis 520 demonstrates how any number of SOFCs may be included in the energy server 505. While FIG. 5 shows an example involving the use of SOFCs, a skilled person in the art will recognize how any other type of energy source can also be used or can alternatively be used in lieu of the SOFCs.

The SOFCs output DC power, and the output is often (though not always) between about 50 KW and about 75 KW. An energy server can output between about 300 KW and about 325 KW.

FIG. 5 also shows how the unit 500 includes an ultra-capacitor, as shown by capacitor 525. The capacitor 525 is provided to facilitate ramp up events in which the unit 500 is to be brought online in a rapid manner to provide power. The capacitor 525 can essentially operate to discharge power immediately while the SOFCs ramp up. Once the SOFCs are operating, they can also be used to charge the capacitor 525. Optionally, the capacitor 525 can be a 100 KW or 1500 KJ type of capacitor. Of course, other sizes can be used as well. An alternative to the capacitor 525 can be the flywheel mentioned earlier.

The capacitor 525 and the energy server 505 are shown as sharing a common DC bus, as shown by common DC 530. This common DC 530 is representative of the common DC 420 from FIG. 4. As a result of this common DC bus, if any particular datacenter load is high, any number of the capacitors and/or the power units can be used to help service that load.

Providing the common DC 530 allows all the stamps to access a common pool of DC energy, which includes the capacitor's stored power. Notably, any number of capacitors can be included in the architecture.

This common connection on the DC side also addresses the sudden load changes that might occur in each line-up or temporary uneven loadings on the AC side. That is, if one line-up is being overloaded, it can draw more energy from the DC side as long as that energy is available without causing a voltage drop on that DC bus, which acts like the heartbeat of the entire system.

The inclusion of more modules/power units results in a higher step load capability that can be offered to each line-up. Additionally, sharing a large DC energy bus is an advantage since SOFC technology is designed for baseload coverage and ultra-capacitors provide the step load energy for a short period of time before the SOFCs can ramp up their power to take over the load from the ultra-capacitor(s).

The same power sharing feature applies to the overload scenarios on one or more line-ups. This also is true when the load on the AC side of the inverters suddenly drops on one line-up since the extra energy on the DC side can be picked up by other medium voltage line-up(s) that may be experiencing load increases. Therefore, by connecting all DC buses, this design provides a bank of energy whose energy versus time graphs are flatter compared to those for the individual DC buses if they were not tied together. Because it is difficult to predict the max load changes on one line-up (e.g., because it has to do with the customer demand and not the datacenter line-up characteristics), the disclosed embodiments are highly advantageous because they provide a high level of flexibility in dealing with unpredictable loads.

The capacitor 525 and the energy server 505 are also shown as being coupled or connected to a power inverter 535. The inverter 535 converts DC power to AC power. Optionally, a breaker 540 can be disposed downstream of the inverter 535. The inverter 535 is then connected to a transformer, such as the transformer 425 from FIG. 4. Often, the power inverter 535 is a 355 KVA inverter, though other sizes can be used.

Inverter 535 can be considered as being a main or central inverter that services multiple SOFCs. In some implementations, however, each respective SOFC may be provided or associated with its own corresponding inverter. Thus, in some cases, the number of inverters in the system may match the number of power units or SOFCs. In other cases, a single inverter may be provided for each power unit, where that power unit may include multiple different SOFCs.

In an islanded operation, by closing the normally open breakers (e.g., breaker 370 from FIG. 3), the first stamp black starts other stamps and the entire system. Once the system starts up and voltage and frequency are stable, those other breakers (e.g., breakers 375 and 380) can open to avoid large fault currents on the AC side and to isolate the modules/power units, thereby minimizing various interference risks. This is beneficial because once the output of the power units are tied, they can push power into the other side and create inverter issues.

These breakers (e.g., breakers 370, 375, and 380) can be used as normally open if the utility is available. In the presence of the utility, a black start can be performed by the utility. If the utility fails and the power units (e.g., the SOFCs) take over the load after a break, there is no need to close these breakers as the power units (e.g., the fuel cells in those units) go to standby and will turn back on as soon as the system is fully isolated from the grid. This time interval (i.e. the time when the inverters go to standby and back) is also used for the inverters to switch from the current source or "Grid Following" mode to voltage source or "Grid Forming" mode.

Stated differently, during grid operation, the SOFCs are able to work in parallel with the grid. If the utility fails, the system has a period of time (e.g., 2 seconds or whatever time is set based on regional code) to isolate itself from the grid. The SOFCs are able to go to standby mode or to seamlessly switch to the grid forming mode. This process can be rolled out in phases (e.g., perhaps 10 MW, 20 MW, etc.) or all at once.

A control mechanism, service, or controller is used to control the normally open breakers (e.g., breakers 370, 375, and 380) depending on the operation scenario. For instance, the service 300A of FIG. 3 can operate as this control mechanism.

The controller uses a control algorithm, which looks at utility voltage and frequency as well as the status of each breaker. This algorithm is unique due to the novel configuration disclosed herein. Generally, the control mechanism commands the breakers to be opened or closed depending on the system working with or without the utility. These breakers can also be used to feed any combination of the line-ups with any combination of the modules/power units. This feature is advantageous, particularly when downstream transformers or datacenter breakers fail. Using these breakers, two neighboring modules/power units can be connected, and the power can circumvent the failed utility component.

In this regard, the embodiments utilize a central controller (e.g., service 300A) that coordinates all the stamps' activities. Each stamp can also optionally have its own controller, which can communicate with the central controller.

The status of the utility (e.g., available/not available) impacts the normally open breakers' statuses. If the utility is available, then the controller will leave the breakers open unless there is a need to combine modules. If the utility is not available, the breakers are closed during the startup only. Upon a fully successful startup, the breakers can be opened. The breakers remain open once the system starts up with the utility, even if the utility fails and the power units (e.g., the SOFCs) take over the load. That is because, upon a utility failure, the inverters go to a standby state and wait for a "utility-isolation" signal to return in voltage source (grid forming) mode prior to taking over the load.

Control Processes

At a high level, the disclosed embodiments are directed to a distributed, reliable, potentially zero emission, redundant, scalable, and 24×7 available fuel cell solution, where the details of the operation and black start are described herein. The disclosed scheme can black start the system with or without the utility. The design, block connections, integration into the datacenter infrastructure, and the control logics are unique over traditional architectures and methodologies.

Generally, if the black start is performed with the utility, the normally open breakers remain open during the startup.

Otherwise, they are closed so the first stamp starts up the rest of the stamps. The normally open breakers can also close to combine modules/power units when some downstream equipment of one module fails so the power can go through that path.

All DC buses on the stamps can be connected, thereby providing the pool of DC energy, including ultra-capacitors, to each line-up. Inverter based technology has low fault current, hence the application of a flywheel-based technology to the system can also be used. Additionally, or alternatively, a rotary UPS, motor, or generator set can be used in lieu of a flywheel or a capacitor. The use of a flywheel can further improve stability, fault current, and fast injection/absorption of the power. The embodiments can also employ zone selective interlocking (ZSI) or voltage controlled (Re-strained) protection to be used to detect low fault currents.

It should be noted how any comparable fuel cell technology can be used for this design. The scope covers the seamless current source to voltage source and vice versa transfer or a break-before-make depending on the design and load requirements. Even so-called "green" hydrogen can be used as fuel. This solution breaks down any barrier for datacenter builds in regions with limited to no power capacity. Power generation for the datacenters can become local with zero-emission, which is a significant milestone to meet. The reliability and redundancy of this solution can meet any design as both the number of fuel cells in an energy server and the number of energy servers in a stamp are adjustable. Additionally, redundancy increases with the number of the fuel cells for a fixed load.

Figure 6:
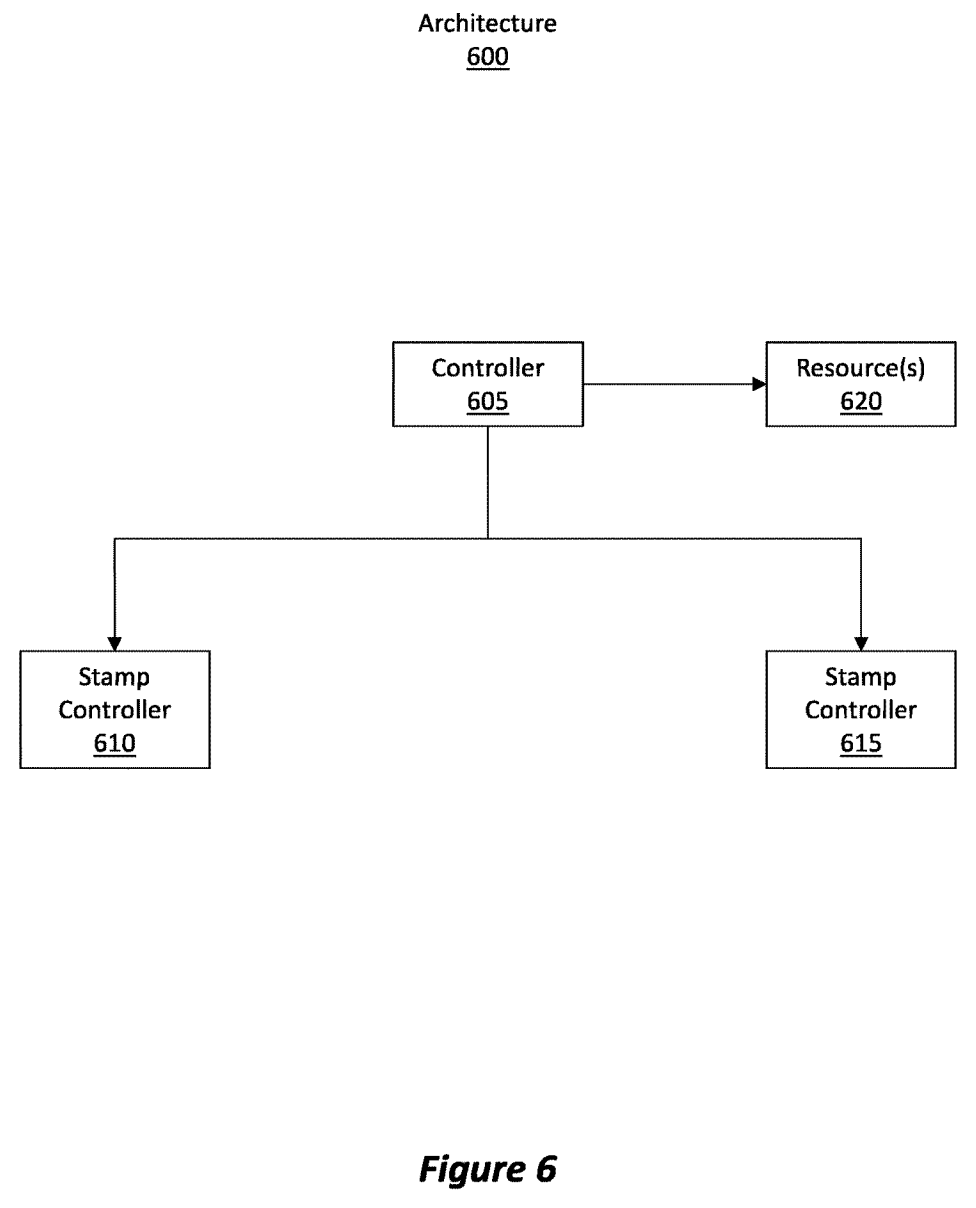
Figure 7:
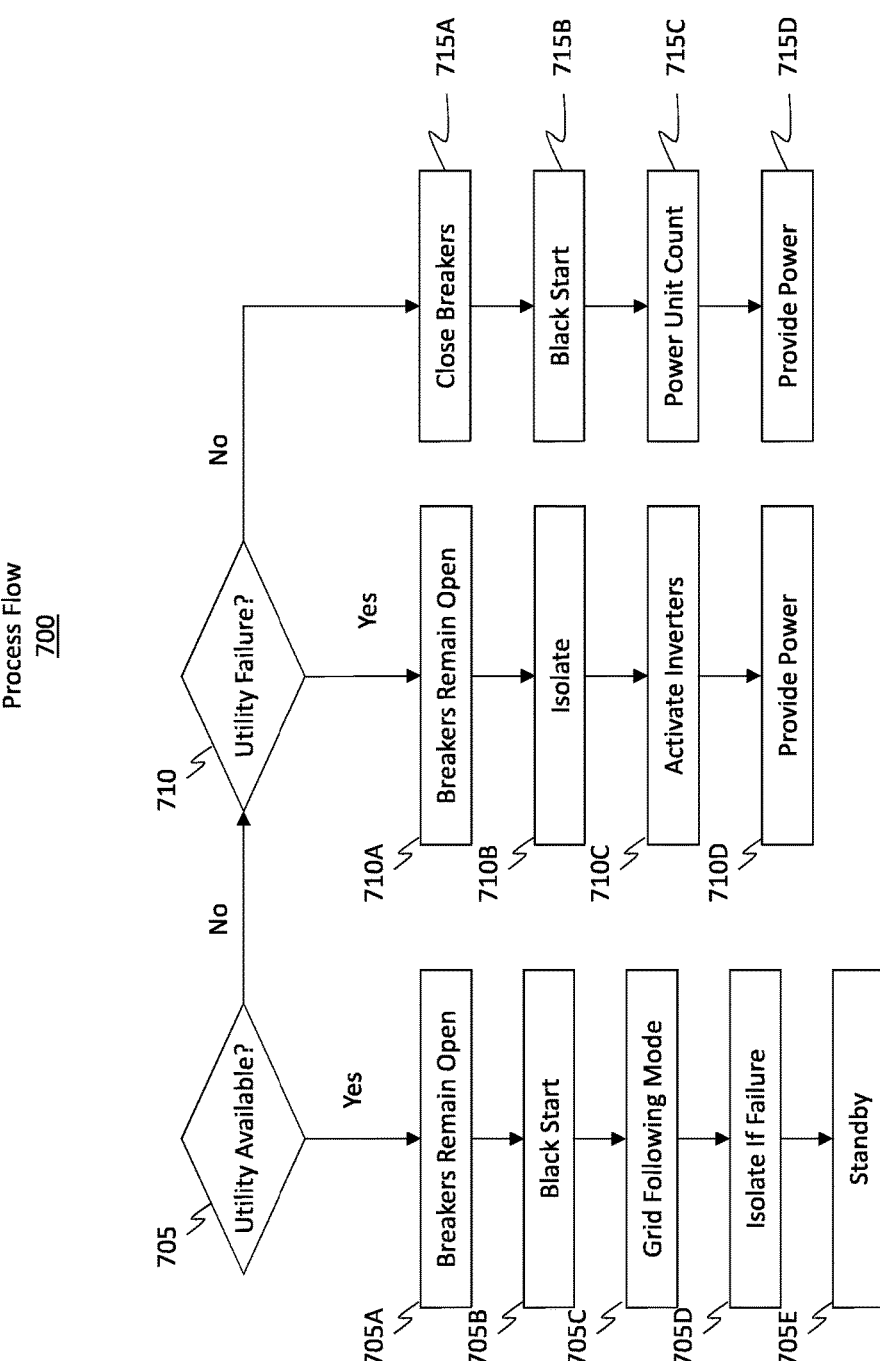
FIG. 7 illustrates a process flow detailing how the stamps can be controlled.

Attention will now be directed to FIGS. 6 and 7. FIG. 6 illustrates an example architecture 600 that can facilitate the operations disclosed herein, including the processes shown in the flow chart of FIG. 7. Stated differently, the processes in the flowchart can be facilitated using the architecture 600 of FIG. 6. Thus, frequent reference will be made between FIGS. 6 and 7.

Architecture 600 of FIG. 6 includes a controller 605, which is an example implementation of the service 300A of FIG. 3. Controller 605 is an example of the central controller mentioned earlier. Controller 605 can be a type of service, as described earlier.

In some cases, controller 605 can be implemented in a cloud environment such that controller is a cloud-based service. In some cases, controller 605 can be implemented locally on a device. In some cases, controller 605 can be a hybrid service that includes a cloud-based component and a local component.

Controller 605 is able to control or manage any number of local, stamp-based controllers, such as stamp controller 610 and stamp controller 615. For instance, stamp controller 610 may control the operations of the stamp 340 from FIG. 3. Similarly, stamp controller 615 may control the operations of the stamp 345 from FIG. 3. Such operations include, but are not limited to, controlling the various different breakers, inverters, capacitors (e.g., discharge, charge, etc.), and power units (e.g., the SOFCs) of the stamps. Controller 605 can also control various other resource(s) 620 (e.g., a BESS or PV).

Controller 605 is able to facilitate the operations shown in the process flow 700 of FIG. 7. With regard to the discussion of FIG. 7, this discussion will refer to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Example Methods

The following discussion now refers to a number of methods/processes and method acts that may be performed. Although the method acts may be discussed in a certain order or illustrated in a flow chart as occurring in a particular order, no particular ordering is required unless specifically stated, or required because an act is dependent on another act being completed prior to the act being performed. Process flow 700 can be implemented by the service 300A of FIG. 3. Inasmuch as controller 605 of FIG. 6 is an example implementation of service 300A, process flow 700 can also be implemented by the controller 605.

Process flow 700 can be implemented within the architecture 300 of FIG. 3. For instance, the architecture is designed to provide auxiliary power to a datacenter that is normally services by a power utility. The architecture or system can include a controller, a first stamp, and a second stamp. The system/architecture can further include a common DC bus that couples the first stamp to the second stamp. The system further includes a common AC bus that couples the first stamp to the second stamp. Even further, the system can include an AC breaker disposed on the AC bus between the first stamp and the second stamp. The controller controls whether the AC breaker is open or closed. Furthermore, the default state of the AC breaker is an open state.

Process flow 700 (i.e. a method) initially includes an act 705 of determining whether the utility is available. As an example, the controller 605 may have a voltage or current sensing mechanism attached to the line from the utility. If a signal is observable on the line, then the controller 605 can determine that the utility is currently providing power to the datacenter. If no signal is observable, then the controller 605 can determine that the utility is not currently providing power to the datacenter.

If the utility is available (i.e. the "yes" branch), then the controller 605 can facilitate act 705A, which includes causing the normally open breakers to remain open. For instance, breakers 370, 375, and 380 are caused to remain open on the common AC line 360 (or breaker 465 from FIG. 4). It may be the case that the breakers include a wireless fidelity (Wi-Fi) connection, a Bluetooth connection, or some other wireless or wired connection. The controller 605 is able to communicate with these various different breakers to control their state. In some cases, the breakers can be considered as an Internet of Things (IoT) device, and they may optionally be controlled from the cloud.

Act 705B then includes black starting the system. This black start can be performed using either the utility or the power units. Black start generally includes energizing the whole system, which means first bringing up all resources, then connecting loads and monitoring the system for a period of time until everything is fully stable.

Act 705C includes causing the power units and the utility to work in parallel with one another. Here, the power units are caused to operate in the grid following mode.

Act 705D includes determining whether a grid failure has occurred, such as by analyzing voltage and frequency characteristics. If a grid failure has occurred, then the controller 605 causes the datacenter to be isolated (e.g., using switch 320A from FIG. 3 or the upstream breakers near the transformers 310 and 315) from the grid within a threshold number of seconds (e.g., perhaps two seconds). Act 705E then includes causing the power units to go to standby mode.

The power units can return after confirmation of the grid isolation. Alternatively, the power units can seamlessly transfer to the grid forming mode.

On the other hand, if the utility is not available (i.e. the "no" branch), then act 710 is performed. As mentioned, the controller may determine that the utility is not available by attempting to observe a power signal on the line from the utility. If no signal is observable, then the utility is likely not online or is at least not providing power to the datacenter.

Act 710 includes determining whether the unavailability of the utility is the result of a utility failure. If the unavailability is due to a utility failure, then act 710A is performed. Any type of utility failure may occur. As various examples, a utility failure may include a break in the power line. A utility failure may also include a scenario where the power source for the utility is currently offline. Indeed, any type of failure may occur. The controller 605 is able to communicate with the utility to determine whether the utility is offline. In some instances, the controller 605 can trigger a query or alarm to be sent to an administrator at the utility to determine whether the utility failure has occurred.

Act 710A includes causing the normally open breakers to remain open. For instance, breakers 370, 375, and 380 are caused to remain open (or breaker 465 from FIG. 4).

Act 710B then includes isolating the datacenter from the utility. Act 710C then includes switching the inverters (e.g., inverter 535 from FIG. 5) from standby to active mode. Act 710D then includes having the power units provide power in a reliable, redundant, and continuous manner.

On the other hand, if the unavailability is not due to a utility failure (i.e. the "no" branch), then act 715A is performed. Unavailability might be due to maintenance reasons. For instance, a technician may currently be managing or maintaining the line to the utility or perhaps the utility itself. The breakers are here to address the black start issue when the system starts in grid forming mode. Act 715A includes closing the normally open breakers. For instance, breakers 370, 375, and 380 (or breaker 465 from FIG. 4) are caused to be closed.

Act 715B then involves the power units performing a black start to the system. Those power units are also caused to run in grid forming mode.

Optionally, the stamps can be caused to operate in a ramp up manner over a defined period of time. For instance, a first stamp can ramp up over a select number of seconds. Then, one, some, or all of the other stamps can startup immediately after sensing a stable voltage produced by the first stamp. The normally open breakers (e.g., breakers 370, 375, and 380) are closed in this situation to allow for a fast start up of the system. Doing so allows the fast start up of the system regardless of the number of stamps.

Act 715C then includes calculating how many power units may be needed. This calculation can optionally be based on the design and/or required reliability and redundancy desires. Act 715D then includes causing the system to provide power to the datacenter in a reliable, redundant, and continuous manner.

Advantageously, the disclosed principles can be the key to either filling the power capacity gap before the utility can deliver the required power to a new datacenter (e.g., a stand-alone microgrid) or it can provide a permanent scalable local power resource solution to a datacenter. The scheme can work with other distributed energy resources in the system either in grid forming or grid following mode. A flywheel-based technology addition can also be used to address the low fault current of the fuel cell inverters. The proposed scheme can build a microgrid by itself or it can be part of a microgrid system, where the SOFC is the baseload resource and other resources can be added to the microgrid and can work with the SOFC.

The disclosed principles can be used to address a phase-by-phase expansion or a full-scale build of a datacenter. The principles can also be used to address unpredictable load changes on the datacenter loads. Traditionally, supplemental power systems were designed for baseload coverage, not for unpredictable coverage. The principles can also enable for a quick start-up of the SOFC units in stand-alone mode (without the utility) by connecting all of the stamps on the AC side (to enable a first stamp to initially ramp up and then to enable the remaining stamps to immediately start up) via certain breakers (e.g., breakers 370, 375, and 380).

One primary benefit and distinction of the disclosed embodiments over traditional techniques relates to the introduction of a distributed and scalable scheme for a technology that is designed for baseload demand, where it can expand indefinitely and cover baseload, load steps, and make a microgrid with or without other distributed energy resources. This solution can be implemented by any cloud service provider that is aiming to find a local generation resource for its datacenters and to reduce or eliminate carbon emissions from its generation plans.

Accordingly, some of the disclosed embodiments are generally and beneficially directed to the unique arrangement of fuel cell DC and AC bus connections and the integration of those connections with a datacenter's power infrastructure, operational logic, and black start processes. The embodiments are able to fill the power capacity gap before the utility can deliver the required power to a new datacenter (e.g., a stand-alone microgrid). The embodiments can also provide a permanent scalable local power resource solution to the datacenters. The scheme can work with other distributed energy resources in the system either in grid forming or grid following mode. A flywheel-based technology addition can also be used to address the low fault current of the fuel cell inverters.

Example Computer/Computer Systems

Figure 8:
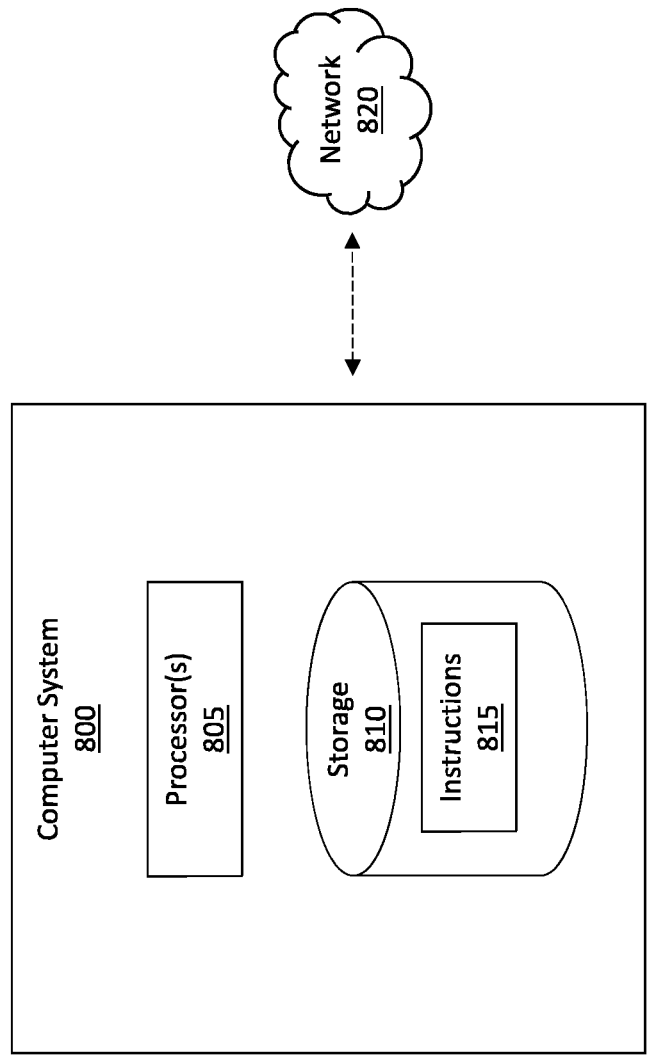
FIG. 8 illustrates an example computer system capable of performing any of the disclosed operations.

Attention will now be directed to FIG. 8 which illustrates an example computer system 800 that may include and/or be used to perform any of the operations described herein. For instance, computer system 800 can implement the controller 605 of FIG. 6 or the service 300A of FIG. 3 or any of the other controllers or services mentioned in this disclosure.

Computer system 800 may take various different forms. For example, computer system 800 may be embodied as a tablet, a desktop, a laptop, a mobile device, or a standalone device, such as those described throughout this disclosure. Computer system 800 may also be a distributed system that includes one or more connected computing components/devices that are in communication with computer system 800.

In its most basic configuration, computer system 800 includes various different components. FIG. 8 shows that computer system 800 includes one or more processor(s) 805 (aka a "hardware processing unit") and storage 810.

Regarding the processor(s) 805, it will be appreciated that the functionality described herein can be performed, at least in part, by one or more hardware logic components (e.g., the processor(s) 805). For example, and without limitation, illustrative types of hardware logic components/processors that can be used include Field-Programmable Gate Arrays ("FPGA"), Program-Specific or Application-Specific Integrated Circuits ("ASIC"), Program-Specific Standard Products ("ASSP"), System-On-A-Chip Systems ("SOC"), Complex Programmable Logic Devices ("CPLD"), Central Processing Units ("CPU"), Graphical Processing Units ("GPU"), or any other type of programmable hardware.

As used herein, the terms "executable module," "executable component," "component," "module," "controller," "service," or "engine" can refer to hardware processing units or to software objects, routines, or methods that may be executed on computer system 800. The different components, modules, engines, and services described herein may be implemented as objects or processors that execute on computer system 800 (e.g. as separate threads).

Storage 810 may be physical system memory, which may be volatile, non-volatile, or some combination of the two. The term "memory" may also be used herein to refer to non-volatile mass storage such as physical storage media. If computer system 800 is distributed, the processing, memory, and/or storage capability may be distributed as well.

Storage 810 is shown as including executable instructions 815. The executable instructions 815 represent instructions that are executable by the processor(s) 805 of computer system 800 to perform the disclosed operations, such as those described in the various methods.

The disclosed embodiments may comprise or utilize a special-purpose or general-purpose computer including computer hardware, such as, for example, one or more processors (such as processor(s) 805) and system memory (such as storage 810), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are "physical computer storage media" or a "hardware storage device." Furthermore, computer-readable storage media, which includes physical computer storage media and hardware storage devices, exclude signals, carrier waves, and propagating signals. On the other hand, computer-readable media that carry computer-executable instructions are "transmission media" and include signals, carrier waves, and propagating signals. Thus, by way of example and not limitation, the current embodiments can comprise at least two distinctly different kinds of computer-readable media: computer storage media and transmission media.

Computer storage media (aka "hardware storage device") are computer-readable hardware storage devices, such as RAM, ROM, EEPROM, CD-ROM, solid state drives ("SSD") that are based on RAM, Flash memory, phase-change memory ("PCM"), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

Computer system 800 may also be connected (via a wired or wireless connection) to external sensors (e.g., one or more remote cameras) or devices via a network 820. For example, computer system 800 can communicate with any number devices or cloud services to obtain or process data. In some cases, network 820 may itself be a cloud network. Furthermore, computer system 800 may also be connected through one or more wired or wireless networks to remote/separate computer systems(s) that are configured to perform any of the processing described with regard to computer system 800.

A "network," like network 820, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. Computer system 800 will include one or more communication channels that are used to communicate with the network 820.

Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RAM and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system that provides auxiliary power to a datacenter that is normally serviced by a power utility, said system comprising:
   a controller;
   a first stamp that includes a first solid oxide fuel cell (SOFC) and a second SOFC, both the first and second SOFCs are coupled to corresponding inverters, and the corresponding inverters are coupled to a transformer, wherein an internal, common direct current (DC) bus couples the first SOFC to the second SOFC;
   a second stamp;
   an external, common direct current (DC) bus that couples the first stamp to the second stamp;
   a common alternating current (AC) bus that couples the first stamp to the second stamp; and
   an AC breaker disposed on the AC bus between the first stamp and the second stamp, wherein the controller controls whether the AC breaker is open or closed, and wherein a default state of the AC breaker is an open state.

2. The system of claim 1, wherein the first stamp includes one or more energy sources.

3. The system of claim 2, wherein the one or more energy sources include a solid oxide fuel cell (SOFC).

4. The system of claim 1, wherein the second stamp includes one or more energy sources.

5. The system of claim 4, wherein the one or more energy sources include a solid oxide fuel cell (SOFC).

6. The system of claim 4, wherein the one or more energy sources includes an ultra-capacitor.

7. The system of claim 6, wherein the ultra-capacitor is connected to a step-up transformer.

8. The system of claim 1, wherein a size of the first stamp is equal to a size of the second stamp.

9. The system of claim 1, wherein a size of the first stamp is different than a size of the second stamp.

10. The system of claim 1, wherein the first stamp provides power to the datacenter in parallel with a utility.

11. A method for causing a set of stamps to operate in a grid following mode, where the stamps are coupled together using a common alternating current (AC) bus, said method comprising:
   determining that a power providing utility for a datacenter is currently available to provide power to the datacenter,
   causing a set of breakers that are located on a common AC line to remain open, wherein the set of breakers couple, on the AC line, a plurality of stamps that are able to provide supplemental power to the datacenter; and
   causing the plurality of stamps to operate in a grid following mode while the utility is providing the power to the datacenter,
   wherein:
      the plurality of stamps includes a first stamp,
      the first stamp includes a first solid oxide fuel cell (SOFC) and a second SOFC,
      both the first and second SOFCs are coupled to corresponding inverters, and the corresponding inverters are coupled to a transformer,
      an internal, common direct current (DC) bus couples the first SOFC to the second SOFC, and an external, common DC bus couples the first stamp to a second stamp.

12. The method of claim 11, wherein the plurality of stamps provide power to the datacenter in parallel with the power providing utility.

13. The method of claim 11, wherein the plurality of stamps operates as a current source.

14. The method of claim 11, wherein the plurality of stamps are configurable to operate at different voltage levels.

15. The method of claim 11, wherein the first stamp is connected to a medium voltage side of a step-down transformer.

16. The method of claim 11, wherein direct current (DC) connections of the plurality of stamps are connected internally.

17. A method for causing a set of stamps to provide power to a datacenter, where the stamps are coupled together using a common alternating current (AC) bus, said method comprising:

determining that a power providing utility for a datacenter is currently not available to provide power to the datacenter;

determining that the utility is not currently available due to a utility failure;

causing a set of breakers that are located on a common AC line to remain open, wherein the set of breakers couple, on the AC line, a plurality of stamps that are able to provide supplemental power to the datacenter;

activating a set of inverters that are associated with the plurality of stamps; and causing the plurality of stamps to provide the power to the datacenter, wherein:

the plurality of stamps includes a first stamp, the first stamp includes a first solid oxide fuel cell (SOFC) and a second SOFC, both the first and second SOFCs are coupled to an corresponding inverters, and the corresponding inverters are coupled to a transformer, an internal, common direct current (DC) bus couples the first SOFC to the second SOFC, and an external, common DC bus couples the first stamp to a second stamp.

18. The method of claim 17, wherein direct current (DC) connections of the plurality of stamps are connected internally.

19. The method of claim 18, wherein the DC connections of the plurality of stamps are connected across the plurality of stamps.

20. The method of claim 19, wherein the plurality of stamps operate as a pool of DC energy that is scalable.

* * * * *